US008963905B2

(12) United States Patent
Cho et al.

(10) Patent No.: US 8,963,905 B2

(45) Date of Patent: Feb. 24, 2015

(54) LIQUID CRYSTAL DISPLAY PANEL DRIVING CIRCUIT

(75) Inventors: Hyun-Ho Cho, Incheon-si (KR); Ji-Hun Kim, Daejeon-si (KR); Joon-Ho Na, Daejeon-si (KR); Hyung-Seog Oh, Daejeon-si (KR); Dae-Seong Kim, Daejeon-si (KR); Dae-Keun Han, Daejeon-si (KR)

(73) Assignee: Silicon Works Co., Ltd., Daejeon-Si (KR)

( * ) Notice: Subject to any disclaimer, the term of this patent is extended or adjusted under 35 U.S.C. 154(b) by 995 days.

(21) Appl. No.: 12/912,187

(22) Filed: Oct. 26, 2010

(65) Prior Publication Data

US 2011/0096054 A1 Apr. 28, 2011

(30) Foreign Application Priority Data

Oct. 27, 2009 (KR) ........................ 10-2009-0102453

(51) Int. Cl.

*G09G 5/00* (2006.01)
*H03M 1/00* (2006.01)
*G09G 3/36* (2006.01)
*G09G 3/20* (2006.01)

(52) U.S. Cl.

CPC ................ *G09G 3/3685* (2013.01); *G09G 3/20* (2013.01); *G09G 3/3696* (2013.01); *G09G 2310/027* (2013.01)

USPC .......................................... 345/211; 341/126

(58) Field of Classification Search

CPC ....................... G09G 2310/027; G09G 3/3696

USPC .......................................... 345/211; 341/126

See application file for complete search history.

(56) References Cited

U.S. PATENT DOCUMENTS

| | | | | |
|---|---|---|---|---|
| 6,266,040 | B1 * | 7/2001 | Nagatomo | 345/98 |
| 7,576,674 | B2 * | 8/2009 | Tsuchi | 341/144 |
| 2002/0033763 | A1 * | 3/2002 | Nakao | 341/154 |
| 2008/0297390 | A1 | 12/2008 | Ko et al. | |

FOREIGN PATENT DOCUMENTS

| | | |
|---|---|---|
| CN | 1680987 | 10/2005 |
| CN | 101004896 | 7/2007 |
| CN | 101174837 | 5/2008 |
| CN | 101419769 | 4/2009 |
| CN | 101488757 | 7/2009 |

(Continued)

*Primary Examiner* — Kumar Patel
*Assistant Examiner* — Randal Willis
(74) *Attorney, Agent, or Firm* — Kile Park Reed & Houtteman PLLC

(57) ABSTRACT

Disclosed is a liquid crystal display panel driving circuit for driving a liquid crystal display panel with a resolution of N bits. N-bit digital data including upper X bits and lower Y bits is inputted. The liquid crystal display panel driving circuit includes a resistor string unit according to areas, a DAC converter switching unit according to areas, and an interpolation amplifier. The resistor string unit outputs analog reference voltages at different ratios according to three areas. The DAC converter switching unit receives the N-bit digital data, selects (Y+1) analog voltages from the analog reference voltages based on the upper X bits, outputs the (Y+1) analog voltages, and outputs the (Y+1) analog voltages of different combinations based on the lower Y bits. The interpolation amplifier receives the (Y+1) analog voltages and generates an interpolated output voltage by setting weights for the (Y+1) analog voltages by using multi-factors.

16 Claims, 4 Drawing Sheets

(56) References Cited

FOREIGN PATENT DOCUMENTS

| | | | |
|---|---|---|---|
| JP | 2002-043944 | A | 2/2002 |
| JP | 2007-195018 | A | 8/2007 |
| JP | 2008-118375 | A | 5/2008 |
| JP | 2009-104056 | A | 5/2009 |
| KR | 2000-0055940 | | 9/2000 |
| KR | 2002-0058503 | | 7/2002 |
| KR | 10-2008-0061556 | | 7/2008 |
| TW | 522656 | | 3/2003 |

* cited by examiner

N Bit input : when N = 8, x= 6, y = 2

| Y2 | Y1 | $Y_A$ | $Y_B$ | $Y_C$ | Output of interpolation amplifier |
|---|---|---|---|---|---|
| 0 | 0 | V1 | V1 | V1 | 0.25V1 + 0.5V1 + 0.25V1 = 1.00V1 |
| 0 | 1 | V1 | V1 | V2 | 0.25V1 + 0.5V1 + 0.25V2 = 0.75V1 + 0.25V2 |
| 1 | 0 | V2 | V1 | V2 | 0.25V2 + 0.5V1 + 0.25V2 = 0.5V1 + 0.5V2 |
| 1 | 1 | V2 | V2 | V1 | 0.25V2 + 0.5V2 + 0.25V1 = 0.25V1 + 0.75V2 |

Output of intermediate area DAC switching unit and output of interpolation amplifier when Y = 2

LIQUID CRYSTAL DISPLAY PANEL DRIVING CIRCUIT

BACKGROUND OF THE INVENTION

1. Field of the Invention

The present invention relates to a liquid crystal display panel driving circuit, and more particularly, to a liquid crystal display panel driving circuit with a significantly reduced area.

2. Description of the Related Art

Recently, the resolution of a display panel such as a television has been increased day by day. With the increase in the resolution of the display panel, the size of a driving circuit for driving a panel in a source driver IC (integrated circuit) of a display apparatus has also been increased.

In such a liquid crystal display panel driving circuit, the area of a circuit is an important factor. When the size of the driving circuit is increased, since the manufacturing cost of the liquid crystal display driving circuit and system is increased and thus competitiveness thereof is reduced, technologies for reducing the area of the liquid crystal display driving circuit are required.

FIG. 1 is a diagram illustrating one example of a liquid crystal display panel driving circuit in accordance with the related art.

The liquid crystal display panel driving circuit 100 illustrated in FIG. 1 includes a resistor string unit 110, DAC (digital-to-analog converter) switching units 121 and 122, buffers 131 and 132, and an output switching unit 140.

The resistor string unit 110 and the digital to analog converter switching units 121 and 122 will be collectively referred to as a resistor DAC.

The resistor string unit 110 includes resistors serially connected to one another. When N-bit digital data is inputted, since the resistor string unit 110 includes $2^N$ resistors and generates different reference voltages at respective connection nodes among the resistors, $2^N$ reference voltages can be generated.

In the liquid crystal display panel driving circuit, the first DAC switching unit 121 receives digital data from a timing controller, selects a single analog reference voltage corresponding to the digital data from the $2^N$ reference voltages generated by the resistor string unit 110, and outputs the selected reference voltage, and the buffer 131 drives the load of the data line of a liquid crystal display panel.

According to an image display scheme of the liquid crystal display panel, since output of the liquid crystal display panel driving circuit is used for driving different pieces of data and an image is displayed through a combination of colors according to each data, a DAC and a buffer (or an amplifier) are necessarily provided for each output corresponding to inputted digital data (refer to the first DAC switching unit 121 and the $m^{th}$ DAC switching unit 122, and the buffers 131 and 132 in FIG. 1).

The most important factor for the resolution of the liquid crystal display panel is the resolution of the DAC. As the resolution of the DAC is increased, natural color sense can be achieved.

However, in order to increase the resolution of the DAC, the bit number N of inputted digital data increases and thus the number of resistors required for the resistor string unit 110 and transistors constituting the DAC switching unit increases by geometric progression, resulting in an increase in the area of the driving circuit. As a result, the manufacturing cost may increase.

SUMMARY OF THE INVENTION

Accordingly, the present invention has been made in an effort to solve the problems occurring in the related art, and an object of the present invention is to provide a liquid crystal display panel driving circuit with a significantly reduced circuit area, in which the area of a DAC circuit taking the bulk of the liquid crystal display panel driving circuit can be significantly reduced by allowing functions of the DAC circuit to be partially performed by an amplifier.

In order to achieve the above object, according to one aspect of the present invention, there is provided a liquid crystal display panel driving circuit for driving a liquid crystal display panel with a resolution of N bits, N-bit digital data inputted to the liquid crystal display panel driving circuit including upper X bits and lower Y bits, the liquid crystal display panel driving circuit including: a resistor string unit according to areas configured to output analog reference voltages at different ratios according to three areas divided based on a voltage range of the N-bit digital data; a digital-to-analog converter switching unit according to areas configured to receive the N-bit digital data, select (Y+1) analog voltages from the analog reference voltages, which are received from the resistor string units according to areas, based on the upper X bits, output the (Y+1) analog voltages, and output the (Y+1) analog voltages of different combinations based on the lower Y bits; and an interpolation amplifier configured to receive the (Y+1) analog voltages and generate an interpolated output voltage by setting weights for the (Y+1) analog voltages by using multi-factors determined by a value of the Y.

According to another aspect of the present invention, there is provided a liquid crystal display panel driving circuit for driving a liquid crystal display panel with a resolution of N bits, N-bit digital data inputted to the liquid crystal display panel driving circuit including upper X bits and lower Y bits, the liquid crystal display panel driving circuit including: a digital-to-analog converter switching unit configured to select (Y+1) analog voltages from analog reference voltages, which are generated based on the upper X bits, according to the N-bit digital data, and output the (Y+1) analog voltages; and an interpolation amplifier configured to receive the (Y+1) analog voltages and generate an interpolated output voltage by setting weights for the (Y+1) analog reference voltages by using multi-factors determined by a value of the Y, wherein the interpolation amplifier includes: a non-inversion input section including a plurality of transistors that receive the (Y+1) analog reference voltages outputted from the digital-to-analog converter switching unit according to areas, and each transistor having a multi-factor according to the number of the lower Y bits; an inversion input section including a plurality of transistors that receive the output voltage of the interpolation amplifier and form pairs together with the non-inversion input section, and each transistor having a multi-factor according to the number of the lower Y bits; a load section operating as an active load of the non-inversion input section and the inversion input section; a first bias application section configured to drive the interpolation amplifier in response to a first bias voltage; a second bias application section including a plurality of transistors that receive a second bias voltage through gates thereof and have same multi-factors as those of the transistors of the non-inversion input section, and supplying a current to the non-inversion input section; and a output section configured to output the output voltage according to voltages changed in the load section, wherein among the transistors constituting the non-inversion input section, the inversion input section, and the second bias application section, transistors having a same multi-factor form differential pairs.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Reference will now be made in greater detail to a preferred embodiment of the present invention, an example of which is illustrated in the accompanying drawings.

Figure 1:
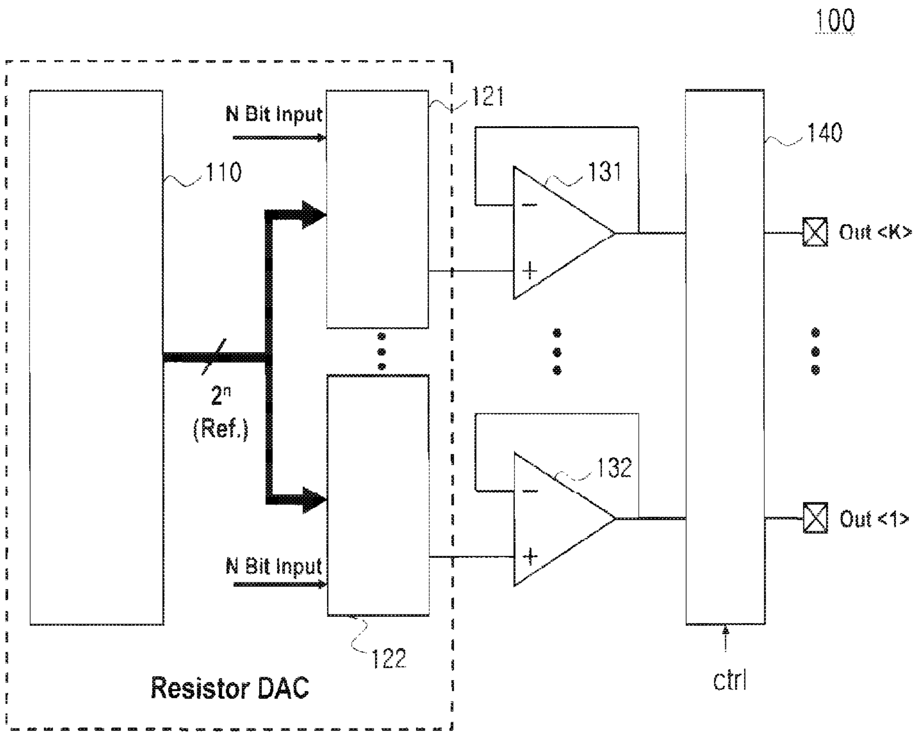
FIG.1 (Prior Art)
FIG. 1 is a diagram illustrating one example of a liquid crystal display driving circuit in accordance with the related art.
Figure 2:
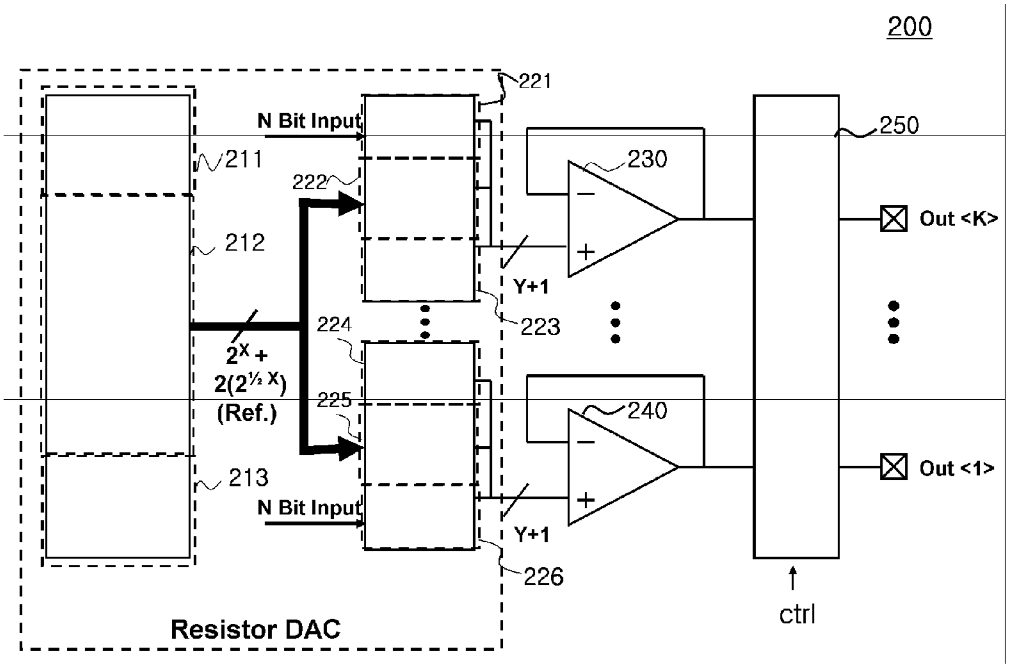
FIG. 2 is a diagram illustrating one example of a liquid crystal display driving circuit in accordance with an embodiment of the present invention.

FIG. 2 is a diagram illustrating a liquid crystal display driving circuit in accordance with an embodiment of the present invention.

The liquid crystal display driving circuit 200 illustrated in FIG. 2 includes resistor string units 211 to 213 according to areas, DAC switching units 221 to 226 according to areas, interpolation amplifiers 230 and 240, and an output switch unit 250.

Figure 3:
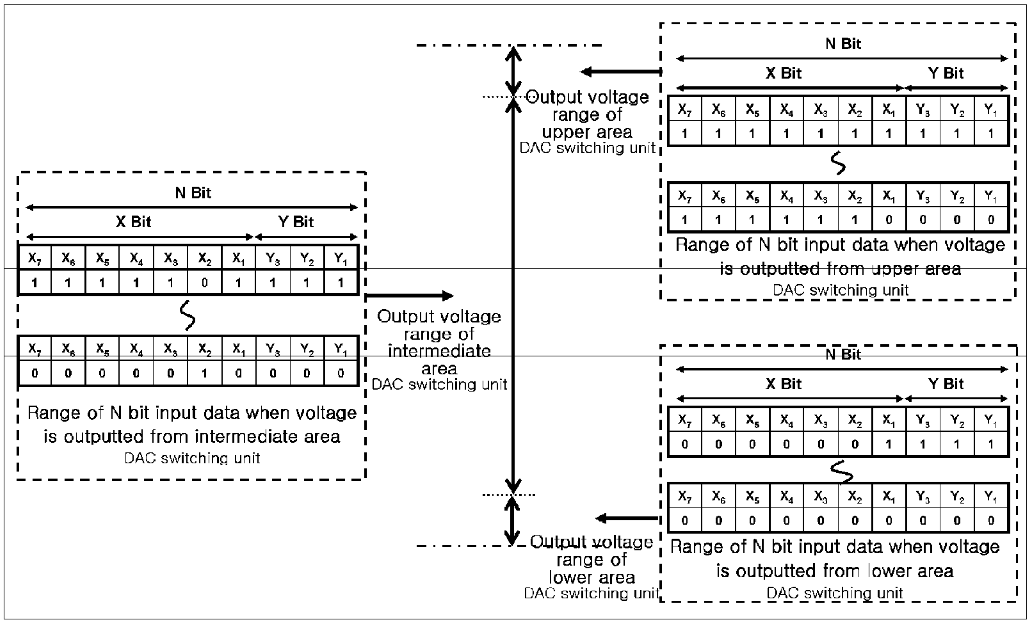
FIG. 3 is a diagram illustrating an output range according to input of the analog-to-digital converter switching unit illustrated in FIG. 2.

Referring to FIG. 3, inputted N-bit digital data (N bit input) includes upper X bits and lower Y bits (X and Y is an integer which is equal to or more than 0). For example, when the N-bit digital data (N bit input) is 10 bits and the upper X bits are 7 bits, the lower Y bits are 3 bits.

The resistor string units 211 to 213 according to areas are configured to output analog reference voltages at different ratios according to three areas divided based on the voltage range of the N-bit digital data.

Specifically, the resistor string units 211 to 213 according to areas are classified as the upper area resistor string unit 211, the intermediate area resistor string unit 212, and the lower area resistor string unit 213 according to the size of the generated reference voltage.

The upper area resistor string unit 211 is configured to generate the highest analog reference voltage in the range of the X bits which are the upper bits. In the upper area resistor string unit 211, a plurality of resistors are disposed in a row and the analog reference voltage are generated from connection points among the resistors. The upper area resistor string unit 211 includes $2^{(1/2)X}$ resistors. When the (½)X (an exponent of 2) is not an integer, the number of resistors is selected using a rounded-off integer value.

The intermediate area resistor string unit 212 is configured to generate analog reference voltages of an intermediate range, except for the highest reference voltage and the lowest reference voltage, in the range of the X bits which are the upper bits. In the intermediate area resistor string unit 212, a plurality of resistors are disposed in a row and the analog reference voltage are generated from connection points among the resistors. The intermediate area resistor string unit 212 includes $2^X$ resistors.

The lower area resistor string unit 213 is configured to generate the lowest analog reference voltage in the range of the X bits which are the upper bits. In the lower area resistor string unit 213, a plurality of resistors are disposed in a row and the analog reference voltage are generated from connection points among the resistors. The lower area resistor string unit 213 includes $2^{(1/2)X}$ resistors. When the (½)X (an exponent of 2) is not an integer, the number of resistors is selected using a rounded-off integer value.

The resistor string units 211 to 213 according to areas include a positive resistor string unit (not shown) for generating a positive reference voltage and a negative resistor string unit (not shown) for generating a negative reference voltage.

The DAC switching units 221 to 223 according to areas are configured to receive the N-bit digital data, select (Y+1) analog voltages from the analog reference voltages, which are received from the resistor string units 211 to 213 according to areas, based on the upper X bits, output the (Y+1) analog voltages, and output the (Y+1) analog voltages of different combinations based on the lower Y bits.

The DAC switching units 221 to 223 according to areas are classified as the upper area DAC switching unit 221, the intermediate area DAC switching unit 222, and the lower area DAC switching unit 223.

The upper area DAC switching unit 221 is controlled by the N-bit digital input data (N bit input) to receive the reference voltages outputted from the upper area resistor string unit 211, selects (Y+1) reference voltages, and transmits (Y+1) output signals to the interpolation amplifier 230. The (Y+1) output signals have the same voltage level. For example, when Y=2, the upper area DAC switching unit 221 outputs (V1, V1 and V1).

Figure 5:
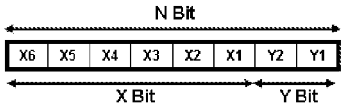
FIG. 5 is a diagram illustrating an example of an output voltage of the analog-to-digital converter switching unit and an output voltage of the interpolation amplifier illustrated in FIG. 2 when Y=2.

The intermediate area DAC switching unit 222 is controlled by the N-bit digital input data (N bit input) to receive the reference voltages outputted from the intermediate area resistor string unit 212, selects (Y+1) reference voltages, and transmits (Y+1) output signals to the interpolation amplifier 230. For example, when Y=2, the intermediate area DAC switching unit 222 outputs the output signals of (V1, V1 and V1), (V1, V1 and V2), (V2, V1 and V2) or (V2, V2 and V1) through a combination of V1 and V2 according to the digital data of the lower bits as illustrated in FIG. 5. The V1 and V2 are values extracted from the reference voltages of the resistor string units 211 to 213 according to areas based on the upper bits. The V2 is higher than the V1 by a predetermined voltage and is an analog reference voltage which is the nearest the V1.

The lower area DAC switching unit 223 is controlled by the N-bit digital input data (N bit input) to receive the reference voltages outputted from the lower area resistor string unit 213, selects (Y+1) reference voltages, and transmits (Y+1) output signals to the interpolation amplifier 230. The (Y+1) output signals have the same voltage level. For example, when Y=2, the lower area DAC switching unit 223 outputs (V1, V1 and V1).

The resistor string units 211 to 213 according to areas may include a switching element or a transistor. For example, the upper area DAC switching unit 221 may be configured to receive the reference voltages outputted from the upper area resistor string unit 211, and output the (Y+1) analog voltages through $2^{(1/2)X}$ transistors which are controlled by the N-bit digital input data (N bit input).

Furthermore, the intermediate area DAC switching unit 222 may be configured to receive the reference voltages outputted from the intermediate area resistor string unit 212, and output the (Y+1) analog voltages through $2^{(1/2)X}$ transistors which are controlled by the N-bit digital input data (N bit input).

Furthermore, the lower area DAC switching unit 223 may be configured to receive the reference voltages outputted from the lower area resistor string unit 213, and output the (Y+1) analog voltages through $2^{1/2X}$ transistors which are controlled by the N-bit digital input data (N bit input).

The interpolation amplifier 230 is configured to receive the (Y+1) analog reference voltages and generate interpolated output voltages by setting a weight for each of the (Y+1) analog reference voltages according to a multi-factor determined by the Y value.

When the reference voltages are received from the upper area DAC switching unit 221 and the lower area DAC switching unit 223 the interpolation amplifier 230 outputs the received reference voltages as is. When the reference voltages are received from the intermediate area DAC switching unit 222, the interpolation amplifier 230 applies the multi-factor to the received reference voltages to generate output voltages.

The interpolation amplifier 230 includes a positive buffer (not shown) for driving the positive reference voltage and a negative buffer (not shown) for driving the negative reference voltage.

The output switch unit 250 is configured to receive the output of the interpolation amplifiers 230 and 240 and supply voltages Out<1>to Out<K>to a liquid crystal display panel. The output switch unit 250 is configured to control a polarity inversion function for inverting the polarity of an output signal to positive polarity or negative polarity in response to a control signal ctrl, a charge share function for reducing current consumption when changing positive polarity and negative polarity, an output enable function and the like. For example, the output switch unit 250 may include a multiplexer.

That is, according to an image display scheme of the liquid crystal display panel, since the output of the liquid crystal display panel driving circuit is used for driving different pieces of data and an image is displayed through a combination of colors according to each data, the DAC switching units 221 to 223 according to areas and the interpolation amplifier 230 are necessarily provided for each output.

In more detail, referring to FIG. 2, in the liquid crystal display panel driving circuit according to the embodiment of the present invention, the inputted digital data (N bit input) is plural, and a plurality of the DAC switching units and a plurality of the interpolation amplifiers are provided corresponding to the digital data. The first to $M^{th}$ DAC switching units 221 to 223 and 224 to 226 according to areas receive different pieces of digital data, and the first to $M^{th}$ interpolation amplifiers 230 and 240 operate by receiving output voltages from the first to $M^{th}$ DAC switching units. Then, the output switch unit 250 is configured to select the output of the interpolation amplifiers 230 and 240 in response to the control signal and transmit the selected output to the liquid crystal display circuit.

Figure 4:
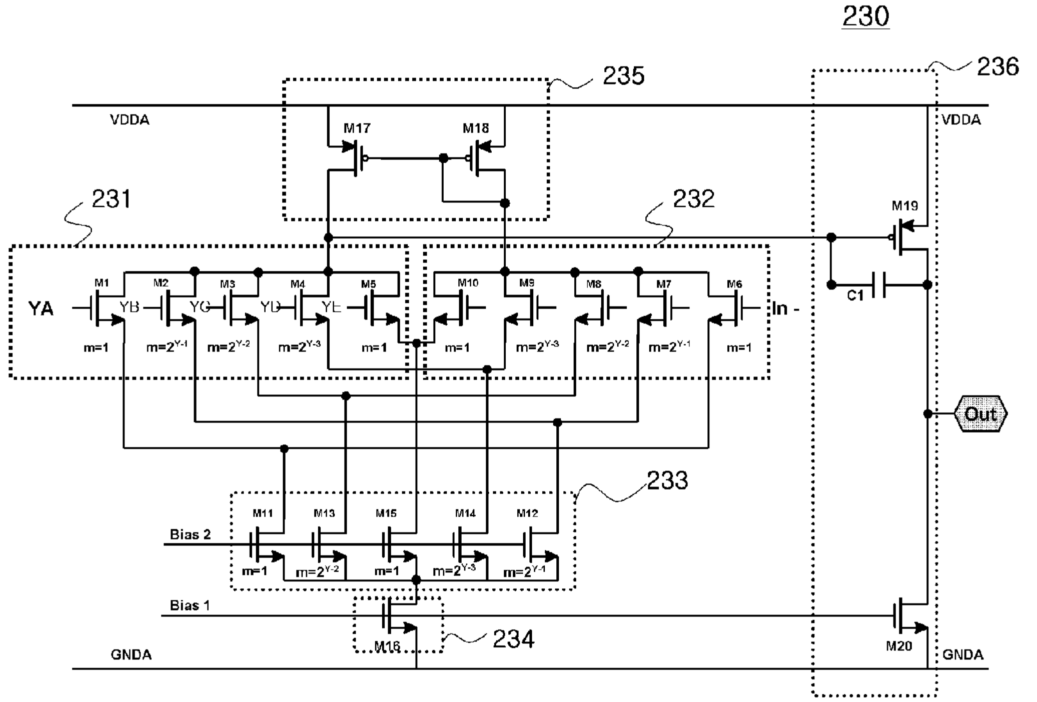
FIG. 4 is a detailed circuit diagram of the interpolation amplifier illustrated in FIG. 2.

FIG. 4 is a detailed circuit diagram of the interpolation amplifier 230 illustrated in FIG. 2.

Referring to FIG. 4, the interpolation amplifier 230 includes a non-inversion input section 231, an inversion input section 232, a first bias application section 234, a second bias application section 233, a load section 235, and an output section 236.

The non-inversion input section 231 includes a plurality of transistors M1 to M5 that receive the (Y+1) analog reference voltages YA, YB, YC, YD and YE outputted from the DAC switching units 221 to 223 according to areas, and each transistor has a multi-factor according to the number of the lower Y bits.

The inversion input section 232 includes a plurality of transistors M6 to M10 that receive the output voltage of the interpolation amplifier 230 and form pairs together with the non-inversion input section 231, and each transistor has a multi-factor according to the number of the lower Y bits.

The load section 235 operates as an active load of the non-inversion input section 231 and the inversion input section 232.

The first bias application section 234 is configured to drive the interpolation amplifier 230 in response to a first bias voltage Bias 1.

The second bias application section 233 includes a plurality of transistors M11 to M15 that receive a second bias voltage Bias 2 through gates thereof and have the same multi-factors as those of the transistors of the non-inversion input section 231, and supplies a current to the inversion input section 232 and the non-inversion input section 231.

The output section 236 is configured to output the output voltage Out according to voltages changed in the load section 235.

Among the transistors constituting the non-inversion input section 231, the inversion input section 232, and the second bias application section 233, transistors having the same multi-factor form differential pairs.

In more detail, the load section 235 includes a seventeenth transistor M17 and an eighteenth transistor M18.

The seventeenth transistor M17 receives a supply voltage VDDA through a first terminal thereof. The eighteenth transistor M18 receives the supply voltage VDDA through a first terminal thereof, and has a gate terminal connected to a gate terminal of the seventeenth transistor M17 and a second terminal connected to the gate terminal of the eighteenth transistor M18.

The non-inversion input section 231 includes the first to fifth transistors M1 to M5.

The first transistor M1 receives the first output signal YA of the DAC switching unit according to areas through a gate thereof, and has a first terminal connected to a second terminal of the seventeenth transistor M17. The second transistor M2 receives the second output signal YB of the DAC switching unit according to areas through a gate thereof, and has a first terminal connected to the second terminal of the seventeenth transistor M17. The third transistor M3 receives the third output signal YC of the DAC switching unit according to areas through a gate thereof, and has a first terminal connected to the second terminal of the seventeenth transistor M17. The fourth transistor M4 receives the fourth output signal YD of the DAC switching unit according to areas through a gate thereof, and has a first terminal connected to the second terminal of the seventeenth transistor M17. The fifth transistor M5 receives the fifth output signal YE of the DAC switching unit according to areas through a gate thereof, and has a first terminal connected to the second terminal of the seventeenth transistor M17.

When Y−1, Y−2 and Y−3 are smaller than 0, that is, when the multi-factors of each transistor are smaller than 1, the second to fourth transistors M2 to M4 are deleted.

The inversion input section 232 includes the sixth to tenth transistors M6 to M10.

The sixth transistor M6 receives the output signal Out of the interpolation amplifier 230 through a gate thereof, and has a first terminal connected to the second terminal of the eighteenth transistor M18 and a second terminal connected to a second terminal of the first transistor M1. The seventh transistor M7 receives the output signal Out of the interpolation amplifier 230 through a gate thereof, and has a first terminal connected to the second terminal of the eighteenth transistor M18 and a second terminal connected to a second terminal of the second transistor M2. The eighth transistor M8 receives the output signal Out of the interpolation amplifier 230 through a gate thereof, and has a first terminal connected to the second terminal of the eighteenth transistor M18 and a second terminal connected to a second terminal of the third transistor M3. The ninth transistor M9 receives the output signal Out of the interpolation amplifier 230 through a gate thereof, and has a first terminal connected to the second terminal of the eighteenth transistor M18 and a second terminal connected to a second terminal of the fourth transistor M4. The tenth transistor M10 receives the output signal Out of the interpolation amplifier 230 through a gate thereof, and has a first terminal connected to the second terminal of the eighteenth transistor M18 and a second terminal connected to a second terminal of the fifth transistor M5. As described above, the gates of the sixth to tenth transistors M6 to M10 are connected to the output terminal of the interpolation amplifier 230 to form a feedback loop.

The output section 236 includes a nineteenth transistor M19, a twentieth transistor M20, and a frequency compensation capacitor c1.

The nineteenth transistor M19 receives the supply voltage VDDA through a first terminal thereof, and has a gate terminal connected to the second terminal of the seventeenth transistor M17. A voltage of a second terminal of the nineteenth transistor M19 serves as an output voltage. The twentieth transistor M20 has a first terminal connected to the second terminal of the nineteenth transistor M19, a gate terminal to which the first bias voltage is applied, and a second terminal connected to a ground voltage GNDA.

The frequency compensation capacitor c1 is connected between the gate terminal and the second terminal of the nineteenth transistor M19.

The first bias application section 234 includes a sixth transistor M16 having a gate terminal to which the first bias voltage Bias 1 is applied and a first terminal connected to the ground voltage GNDA.

The second bias application section 233 includes the eleventh to fifteenth transistors M11 to M15.

The eleventh transistor M11 has a gate terminal to which the second bias voltage Bias 2 is applied, a first terminal connected to a second terminal of the sixth transistor M16, and a second terminal connected to the second terminal of the first transistor M1. The twelfth transistor M12 has a gate terminal to which the second bias voltage Bias 2 is applied, a first terminal connected to the second terminal of the sixth transistor M16, and a second terminal connected to the second terminal of the second transistor M2. The thirteenth transistor M12 has a gate terminal to which the second bias voltage Bias 2 is applied, a first terminal connected to the second terminal of the sixth transistor M16, and a second terminal connected to the second terminal of the third transistor M3. The fourteenth transistor M14 has a gate terminal to which the second bias voltage Bias 2 is applied, a first terminal connected to the second terminal of the sixth transistor M16, and a second terminal connected to the second terminal of the fourth transistor M4. The fifteenth transistor M15 has a gate terminal to which the second bias voltage Bias 2 is applied, a first terminal connected to the second terminal of the sixth transistor M16, and a second terminal connected to the second terminal of the fifth transistor M5.

The first transistor M1, the sixth transistor M6, and the eleventh transistor M11 form a differential pair and have the same multi-factor of $2^{(0)}$. The second transistor M2, the seventh transistor M7, and the twelfth transistor M12 form a differential pair and have the same multi-factor of $2^{(Y-1)}$. The third transistor M3, the eighth transistor M8, and the thirteenth transistor M13 form a differential pair and have the same multi-factor of $2^{(Y-2)}$. The fourth transistor M4, the ninth transistor M9, and the fourteenth transistor M14 form a differential pair and have the same multi-factor of $2^{(Y-3)}$. The fifth transistor M5, the tenth transistor M10, and the fifteenth transistor M15 form a differential pair and have the same multi-factor of $2^{(0)}$.

Among the transistors forming a differential pair, transistors having the same size corresponding to a multi-factor are connected in parallel to one another. For example, the second transistor M2 having a multi-factor of 4 forms a structure in which four transistors having the same size are connected in parallel to one another, and receives the second output signals of the DAC switching units according to areas through the gate thereof.

Preferably, the transistors M1 to M10 constituting the non-inversion input section 231 and the inversion input section 232 have the same size. Preferably, the transistors M11 to M15 constituting the second bias application section 233 have the same size.

A single current source is provided for the input terminal of the interpolation amplifier 230 to increase a current flowing through the input terminal of the interpolation amplifier 230 by increasing a multi-factor. A current flowing through the differential pairs is distributed by the multi-factors of the eleventh to fifteenth transistors M11 to M15 constituting the differential pairs.

Thus, even if each transistor constituting the differential pairs receives the same voltage through the input terminal thereof, a difference occurs in the output voltage of the interpolation amplifier 230 due to the difference of the multi-factors. Consequently, the liquid crystal display panel driving circuit in accordance with the embodiment of the present invention may generate a voltage difference according to the lower bits by using the interpolation amplifier 230 having the multi-factors.

When the $Y-1$, $Y-2$ or $Y-3$ (an exponent of 2 corresponding to the multi-factor) is equal to 0 or a negative number smaller than 0, transistors and input/output nodes of a corresponding differential pair are deleted.

For example, when Y=2, the differential pair including the third, eighth and thirteenth transistors M3, M8 and M13 and the differential pair including the fourth, ninth and fourteenth transistors M4, M9 and M14 are deleted.

When Y is larger than 5, a differential pair is additionally provided. For example, when Y=5, a twenty-first transistor M21 is added to the non-inversion input section 231, a twenty-second transistor M22 is added to the inversion input section 232, and a twenty-third transistor M23 is added to the second bias application section 233.

The transistors M1 to M15 constituting the non-inversion input section 231, the inversion input section 232 and the second bias application section 233 have multi-factors, respectively.

FIG. 5 illustrates the output of the intermediate area DAC switching unit 222 and the interpolation amplifier 230 illustrated in FIG. 2 when Y=2.

That is, FIG. 5 illustrates the case where digital data is 8 bits, upper bits are 6 bits and lower bits are 2 bits, and the output signal of the intermediate area DAC switching unit 222 according to data of Y2 and Y1 (the lower bits).

For example, when Y2=0 and Y1=1, YA=V1, YB=V1 and YC=V2.

Furthermore, when Y=2, multi-factors inputted to the interpolation amplifier 230 are 1, 2 and 1. In addition, weights are 1/(1+2+1), 2/(1+2+1) and 1/(1+2+1), i.e., 0.25, 0.5 and 0.25, respectively. That is, the weights of the transistors constituting the non-inversion input section 231, the inversion input section 232 and the second bias application section 233 are calculated by the multi-factor of each transistor/the sum of the multi-factors of all transistors.

When Y2=0 and Y1=1, the output of the intermediate area DAC switching unit 222 is V1, V1 and V2 and the output voltage of the interpolation amplifier 230 is 0.25V1+0.5V1+0.25V2 (=0.75V1+0.25V2).

Consequently, the liquid crystal display panel driving circuit in accordance with the embodiment of the present invention is configured to generate reference voltages from the resistor string units by using upper bits of digital data and output reference voltages corresponding to lower bits from the interpolation amplifier 230 by using the lower bits.

The present invention is not limited to the liquid crystal display panel driving circuit. For example, the present invention can be applied to driving circuits of general display apparatuses.

In the liquid crystal display driving circuit in accordance with the embodiment of the present invention, a circuit area is significantly reduced. In the driving circuit in accordance with the related art, the number of resistors in resistor string units is $2^N$ and the number of transistors in DAC switching units is $2^N$. Meanwhile, in the driving circuit in accordance with the embodiment of the present invention, the number of resistors is $2^X+2(2^{(1/2)X})$ and the number of transistors is $2^X+2(2^{(1/2)X})$ and $(2^{(Y-3)}+2^{(Y-2)}+2^{(Y-1)})*3$ transistors are additionally provided to an interpolation amplifier. However, since the total number of the resistors and the transistors is significantly reduced, the effect of area reduction can be achieved.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A liquid crystal display panel driving circuit for driving a liquid crystal display panel with a resolution of N bits, N-bit digital data inputted to the liquid crystal display panel driving circuit including upper X bits and lower Y bits, the liquid crystal display panel driving circuit comprising:

a resistor string unit according to areas configured to output analog reference voltages at different ratios according to three areas divided based on a voltage range of the N-bit digital data;

a digital-to-analog converter switching unit according to areas configured to receive the N-bit digital data, select (Y+1) analog voltages from the analog reference voltages, which are received from the resistor string units according to areas, based on the upper X bits, output the (Y+1) analog voltages, and output the (Y+1) analog voltages of different combinations based on the lower Y bits; and an interpolation amplifier configured to receive the (Y+1) analog voltages and the (Y+1 ) analog voltages to the different combinations and output the(Y+1)analog voltages as is and for the (Y+1)analog voltages of different combinations, generate an interpolated output voltage by setting weights according to multi-factor determined by a value of the Y, wherein the interpolation amplifier comprises:

a non-inversion input section;

an inversion input section; and a second bias application section;

wherein each one of the non-inversion input section, the inversion input section and the second bias application section comprises a plurality of transistors each comprising a multi-factor according to the number of the lower Y bits and the transistors constituting the non-inversion input section, the inversion input section and the second bias application section are arranged into a plurality of differential pairs, each differential pair comprising transistors having a common multi-factor and each differential pair comprising a unique multi-factor.

2. The liquid crystal display panel driving circuit according to claim 1, wherein the inputted digital data is plural, the digital-to-analog converter switching unit and the interpolation amplifier are provided in plurality corresponding to the digital data, and an output switch unit is further provided to transmit the output voltages of the interpolation amplifiers to a liquid crystal display panel.

3. The liquid crystal display panel driving circuit according to claim 2, wherein the output switch unit has at least one of a function for changing polarity of output of the interpolation amplifier to positive polarity or negative polarity in response to a control signal ctrl, a charge share function for reducing current consumption, and an output enable function.

4. The liquid crystal display panel driving circuit according to claim 1, wherein the resistor string unit according to areas comprises:

an upper area resistor string unit including $2^{(1/2)X}$ resistors serially connected to one another to generate analog reference voltages corresponding to a highest voltage of the X bits at connection points of the resistors;

an intermediate area resistor string unit including $2^X$ resistors serially connected to one another to generate analog reference voltages corresponding to voltages, except for the highest voltage and a lowest voltage of the X bits, at connection points of the resistors; and a lower area resistor string unit including $2^{(1/2)X}$ resistors serially connected to one another to generate analog reference voltages corresponding to the lowest voltage of the X bits at connection points of the resistors.

5. The liquid crystal display panel driving circuit according to claim 4, wherein the digital-to-analog converter switching unit according to areas comprises:

an upper area digital-to-analog converter switching unit configured to receive the analog reference voltages from the upper area resistor string unit and output the (Y+1) analog voltages through $2^{(1/2)X}$ transistors controlled by the N-bit digital data;

an intermediate area digital-to-analog converter switching unit configured to receive the analog reference voltages from the intermediate area resistor string unit and output the (Y+1) analog voltages through $2^X$ transistors controlled by the N-bit digital data; and a lower area digital-to-analog converter switching unit configured to receive the analog reference voltages from the lower area resistor string unit and output the (Y+1) analog voltages through $2^{(1/2)X}$ transistors controlled by the N-bit digital data.

6. The liquid crystal display panel driving circuit according to claim 5, wherein the intermediate area digital-to-analog converter switching unit is configured to output the (Y+1) analog reference voltages of the different combinations based on the data of the lower Y bits, and when levels of (Y+1) analog reference voltages are different from one other, the (Y+1) analog reference voltages are signals with adjacent voltage levels among the analog reference voltages outputted from the intermediate area resistor string unit.

7. The liquid crystal display panel driving circuit according to claim 5, wherein the upper area digital-to-analog converter switching unit or the lower area digital-to-analog converter switching unit is configured to output the (Y+1) analog reference voltages with a same voltage level.

8. The liquid crystal display panel driving circuit according to claim 5, wherein the upper area resistor string unit or the lower area resistor string unit is configured to calculate a value of the $2^{(1/2)X}$ by using a rounded-off integer value and select the number of resistors when the $2^{(1/2)X}$ (an exponent of 2) is not an integer.

9. The liquid crystal display panel driving circuit according to claim 1, wherein the resistor string unit according to areas comprises:

a positive resistor string unit for generating a positive analog reference voltage; and a negative resistor string unit for generating a negative analog reference voltage.

10. The liquid crystal display panel driving circuit according to claim 9, wherein the interpolation amplifier comprises:

a positive buffer for driving the positive analog reference voltage; and a negative buffer for driving the negative analog reference voltage.

11. The liquid crystal display panel driving circuit according to claim 1, wherein:

the non-inversion input section includes a plurality of transistors that receive the (Y+1) analog reference voltages outputted from the digital-to-analog converter switching unit according to areas, and each transistor having a multi-factor according to the number of the lower Y bits;

the inversion input section includes a plurality of transistors that receive the output voltage of the interpolation amplifier and form pairs together with the non-inversion input section, and each transistor having a multi-factor according to the number of the lower Y bits; and the second bias application section includes a plurality of transistor that receive a second bias voltage through gates thereof and have same multi-factors as those of the transistors of the non-inversion input section, and supplying a current to the non-inversion input section; and the interpolation amplifier further comprises:

a load section operating as an active load of the non-inversion input section and the inversion input section;

a first bias application section configured to drive the interpolation amplifier in response to a first bias voltage; and an output section configured to output the output voltage according to voltages changed in the load section,

12. A liquid crystal display panel driving circuit for driving a liquid crystal display panel with a resolution of N bits, N-bit digital data inputted to the liquid crystal display panel driving circuit including upper X bits and lower Y bits, the liquid crystal display panel driving circuit comprising:

a digital-to-analog converter switching unit configured to output(Y+1) analog voltages according to the upper X bits and output the (Y+1)analog voltages of different combinations according to the lower Y bits from analog reference voltages, which are generated based on the upper X bits; and an interpolation amplifier configured to receive the (Y+1) analog voltages and the(Y+1) analog voltages of the different combinations, and output the (Y+1) analog voltages as is and for the (Y+1) analog voltages of different combinations generate an interpolated output voltage by setting weights by multi-factors determined by a value of the Y, wherein the interpolation amplifier comprises:

a non-inversion input section including a plurality of transistors that receive the (Y+1) analog reference voltages outputted from the digital-to-analog converter switching unit according to areas, and each transistor having a multi-factor according to the number of the lower Y bits;

an inversion input section including a plurality of transistors that receive the output voltage of the interpolation amplifier and form pairs together with the non-inversion input section, and each transistor having a multi-factor according to the number of the lower Y bits;

a load section operating as an active load of the non-inversion input section and the inversion input section;

a first bias application section configured to drive the interpolation amplifier in response to a first bias voltage;

a second bias application section including a plurality of transistors that receive a second bias voltage through gates thereof and have same multi-factors as those of the transistors of the non-inversion input section, and supplying a current to the non-inversion input section; and an output section configured to output the output voltage according to voltages changed in the load section, wherein among the transistors constituting the non-inversion input section, the inversion input section, and the second bias application section, transistors having a same multi-factor form differential pairs.

13. The liquid crystal display panel driving circuit according to claim 12, wherein the first bias voltage or the second bias voltage is supplied from a bias circuit provided outside the interpolation amplifier.

14. The liquid crystal display panel driving circuit according to claim 12, wherein the digital-to-analog converter switching unit is configured to output three analog reference voltages when Y=2, and the non-inversion input section comprises:

a first transistor for receiving a first output signal of the digital-to-analog converter switching unit through a gate thereof, and having a multi-factor of 1;

a second transistor for receiving a second output signal of the digital-to-analog converter switching unit through a gate thereof, and having a multi-factor of 2; and a third transistor for receiving a third output signal of the digital-to-analog converter switching unit through a gate thereof, and having a multi-factor of 3.

15. The liquid crystal display panel driving circuit according to claim 12, wherein the transistors constituting the non-inversion input section, the transistors constituting the inversion input section, and the transistors constituting the second bias application section have a same size.

16. The liquid crystal display panel driving circuit according to claim 12, wherein a single current source is provided for an input terminal of the interpolation amplifier to increase a current flowing through the input terminal of the interpolation amplifier by increasing a multi-factor, and a current flowing through the differential pairs is distributed by the multi-factors of the differential pairs.

* * * * *